United States Patent
Puech

[11] 3,987,421
[45] Oct. 19, 1976

[54] HALOGRAPHIC PROCESS FOR THE REAL-TIME STORAGE AND RETRIEVAL OF HIGH SPEED DIGITALLY ENCODED INFORMATION AND AN APPARATUS FOR IMPLEMENTING SAID PROCESS

[75] Inventor: Claude Puech, Paris, France

[73] Assignee: Thomson-CSF, Paris, France

[22] Filed: Dec. 16, 1974

[21] Appl. No.: 533,163

[30] Foreign Application Priority Data
Dec. 18, 1973  France .............................. 73.45233

[52] U.S. Cl. .......................... 340/173 LM; 350/3.5
[51] Int. Cl.² .................... G11C 8/00; G11C 13/04; G11C 7/00
[58] Field of Search .............. 340/173 LM, 173 LT; 350/3.5

[56] References Cited
UNITED STATES PATENTS

| | | | |
|---|---|---|---|
| 3,657,473 | 4/1972 | Corcoran | 350/3.5 |
| 3,812,496 | 5/1974 | Brooks | 340/173 LM |
| 3,891,976 | 6/1975 | Carlsen | 340/173 LT |

OTHER PUBLICATIONS
B398,551 Jan. 1975, Fukuhara, 340/173 LM.
Roberts et al., High Speed Holographic Digital Recorder; Component Developments and System Experiments, Digest of Technical Papers of Topical Meeting on Optical Storage of Digital Data, 3/19–21/73, pp. WA3–1–4.

Primary Examiner—Stuart N. Hecker
Attorney, Agent, or Firm—Cushman, Darby & Cushman

[57] ABSTRACT

The process consists in splitting the information into N groups of M bits, in recording the groups on N parallel tracks on the carrier, in the form of M holograms differentiated from each other by the pitch of the interference fringes constituent of each hologram. To this end, either a laser of variable wavelength is used, or a reference beam of variable direction. The M holograms are superimposed. At the play-back stage, a fixed coherent light beam projected onto one hologram generates NM beams of different directions. N rows of M photodiodes detect the beams and supply read-out means.

6 Claims, 9 Drawing Figures

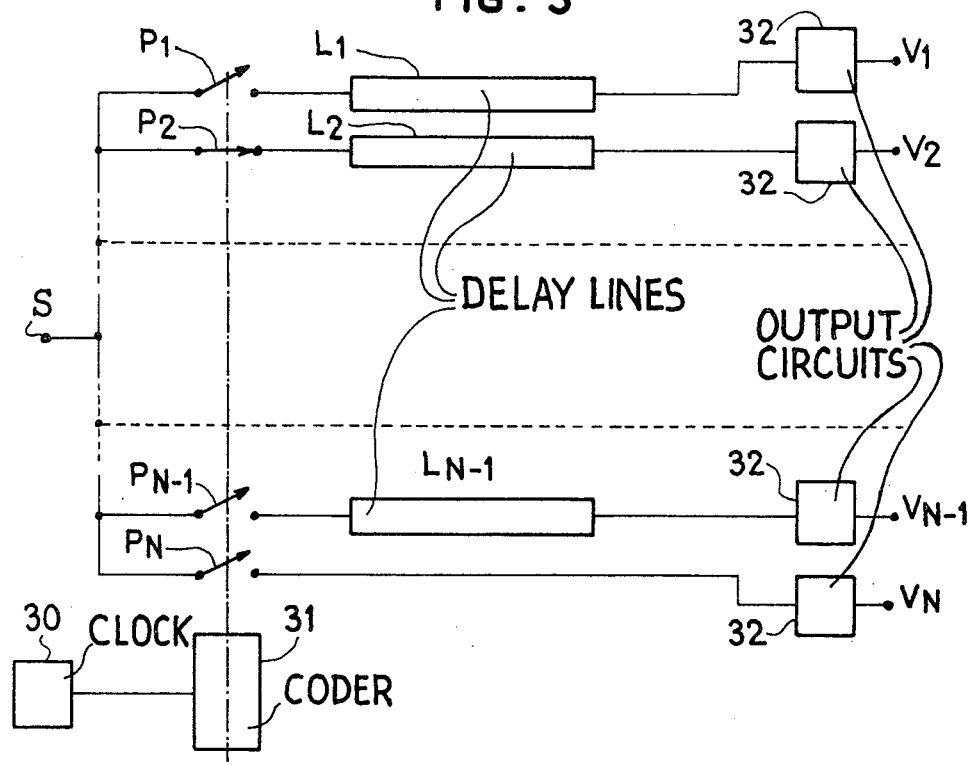
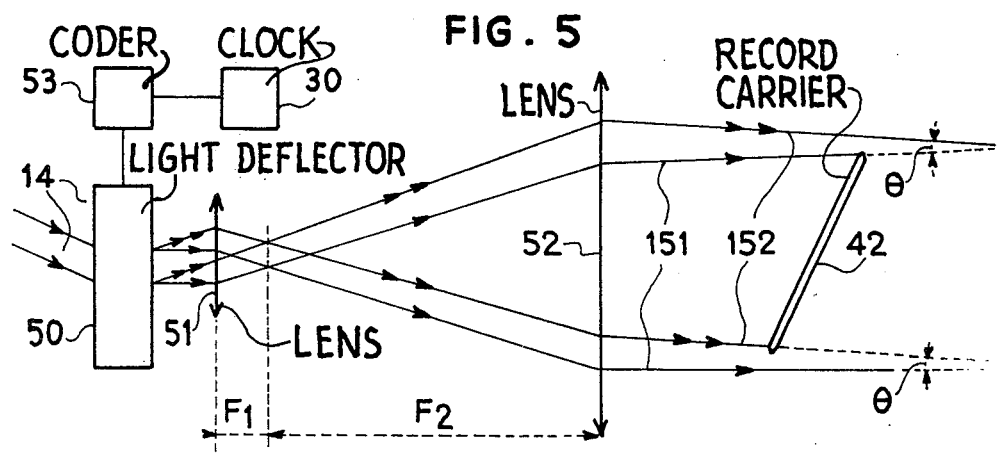

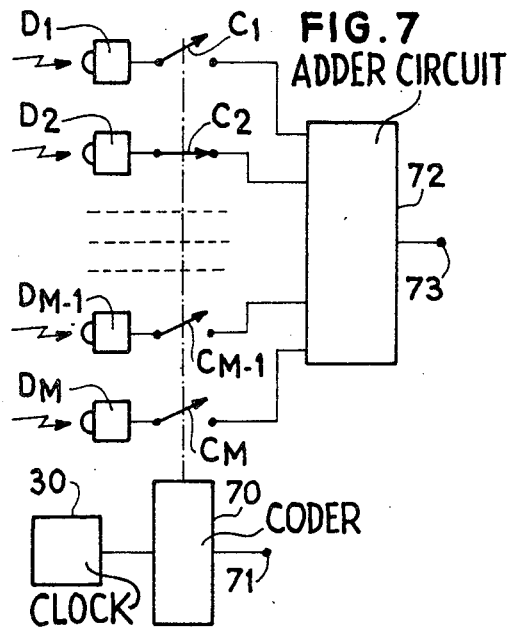
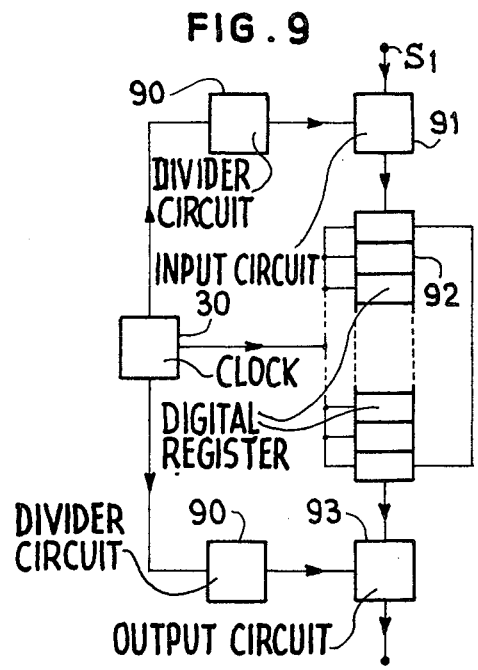
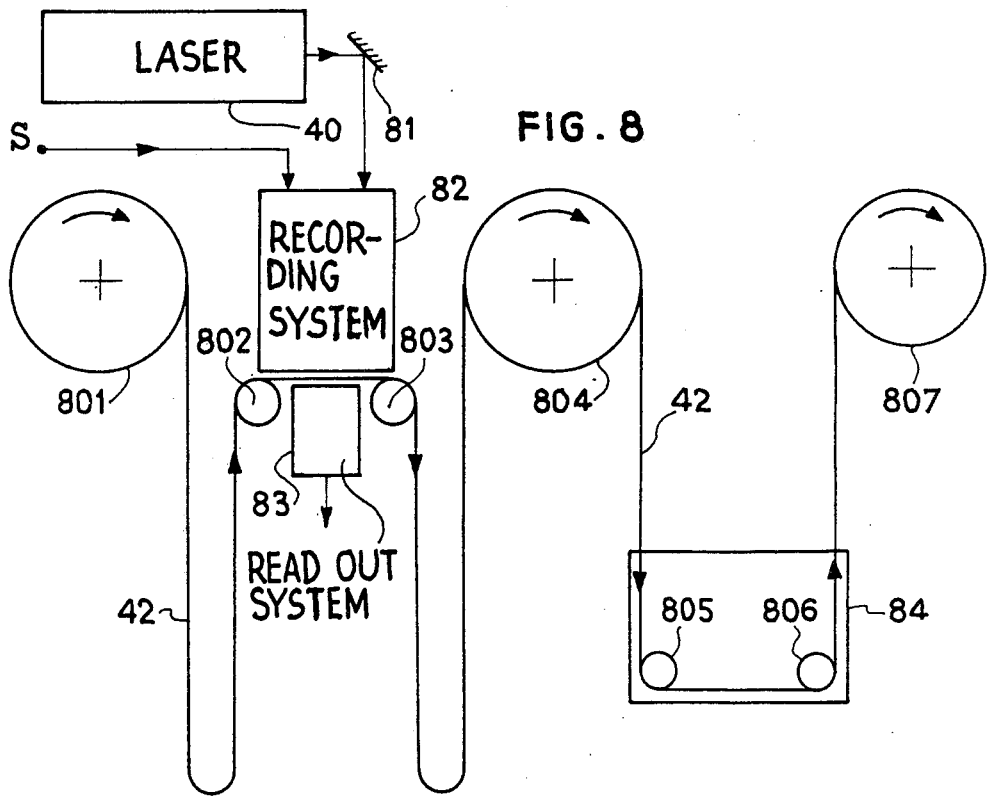

HALOGRAPHIC PROCESS FOR THE REAL-TIME STORAGE AND RETRIEVAL OF HIGH SPEED DIGITALLY ENCODED INFORMATION AND AN APPARATUS FOR IMPLEMENTING SAID PROCESS

The present invention relates to a holographic process for the real-time storage and retrieval of a very high speed digitally encoded information, as well as to the apparatus for implementing said process. The rate of the data bits (1 of 0 digits) constituting the information, corresponds to a frequency which may for example reach as much as 100 MHz. The operation comprises a phase of recording in which the bits, present for example in electrical form, are processed through an electro-optical channel and then recorded upon a physical carrier; it also includes a phase of "play-back" in which the bits are read out through an electro-optical unit and then recovered in electrical form. In the two phases, holography is employed: it is holograms which are upon the carrier.

One of the objects of the invention is to make it possible to process the high frequency data in real-time fashion, and read-out taking place at the rate of the bits.

Those skilled in the art will be well aware of the difficulties and limitations of high speed real-time processing. Since it is necessary to limit the speed of transfer of the physical carrier in the recording and read-out equipment, the storage capacity per unit area of the carrier has to be increased.

In the case of magnetic tapes, a practical limit of around 1600 bits per inch applies when using several parallel tracks over the width of the tape. The rate of data transfer cannot exceed about 1,000,000 bits per second when adding the output from 7 to 9 recording tracks.

It is true that the storage capacity of photo-sensitive carriers can be much higher than that of magnetic tapes. However, by increasing the storage density, the read-out error ratio due to dust and scratches on the data carrier, is increased as well. In the case of very tightly spaced parallel tracks, yawing motions of the data carrier film can also give rise to read-out errors.

The invention overcomes these drawbacks. According to the invention, there is provided a holographic process for the real-time storage and retrieval of a high speed digitally encoded information, in which:

at the storage phase, the processing comprises the breaking down of the information into portions of N groups of M bits, the recording of said M bits belonging to one and the same group on a track of a physical storage carrier in the form of M holograms superimposed said holograms being differentiated from each other by the pitch of the interference fringes constituent of said holograms, and the simultaneous recording of said M bits of the (N − 1) other groups in (N − 1) parallel tracks on the same carrier;

at the retrieval phase, the processing comprises the projection of a fixed coherent monochromatic light beam onto said holograms, the detection of light beams respectively produced by said holograms, and the sequential read-out of the detected currents.

The invention will be better understood and other of its features rendered apparent, from a consideration of the ensuing description and the accompanying drawings in which:

FIGS. 1 and 2 schematically illustrate the principle of the invention;

FIGS. 3, 4, 5, 6 and 7 illustrate parts of an apparatus in accordance with the invention;

FIG. 8 is an overall diagram of an embodiment of an apparatus in accordance with the invention;

FIG. 9 is a diagram of a variant embodiment of part of the apparatus of FIG. 8.

Figure 1:
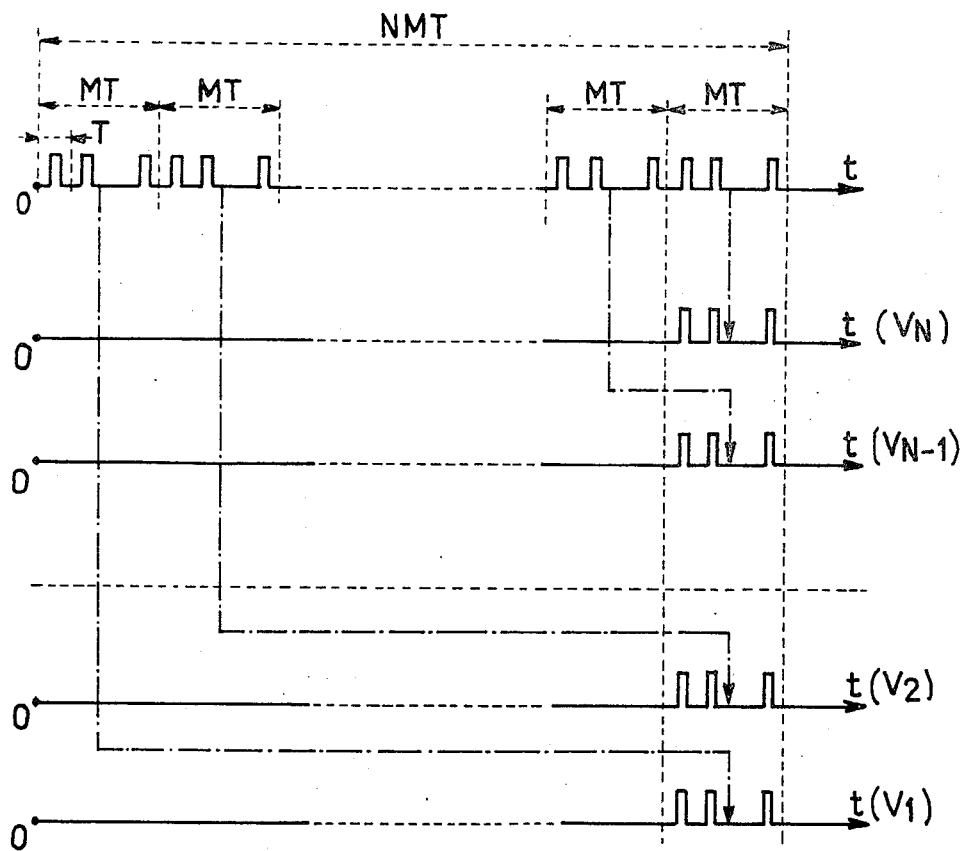

FIG. 1 illustrates the principle of the splitting up of a digitally encoded signal into groups which can be simultaneously recorded in as many tracks as there are groups in a signal portion of duration NMT, T being the recurrence periodicity of the bits. By definition, such a signal is constituted by an uninterrupted (in principle) sequence of squarewave voltages or currents of equal duration. Along a time axis $Ot$, there simply appear the squarewaves representing the 1 bits, the 0 bits being indistinguishable from the $Ot$ axis. During a time interval T chosen in order to contain a whole bit, there is encountered either a squarewave of duration less than T, or, in the limiting condition, a squarewave equal to T, or no squarewave at all. A signal group comprises M time intervals T. In order to simplify illustration, FIG. 1 shows in respect of each group successively two bits, a 0 bit and a 1 bit. It goes without saying that M can be much larger, for example of the order of 100. N has been assumed equal to 10 and only the two first and the two last groups have been shown. Each signal portion of duration NMT undergoes the same processing as the portion shown in FIG. 1.

By means which will be described hereinafter, the N groups are separated so that they can be processed in N separate channels; $V_1, V_2 \ldots V_{N-1}, V_N$. These N channels have been represented by N time axis $Ot$ ($V_N$), $Ot$ ($V_{N-1}$) ... $Ot$ ($V_2$), $Ot$ ($V_1$). The $N^{th}$ is transposed to the $N^{th}$ channel without any delay. This does not apply to the preceding groups which experience delays such that they are aligned, talking in terms of time, with the $N^{th}$ group.

Figure 2:
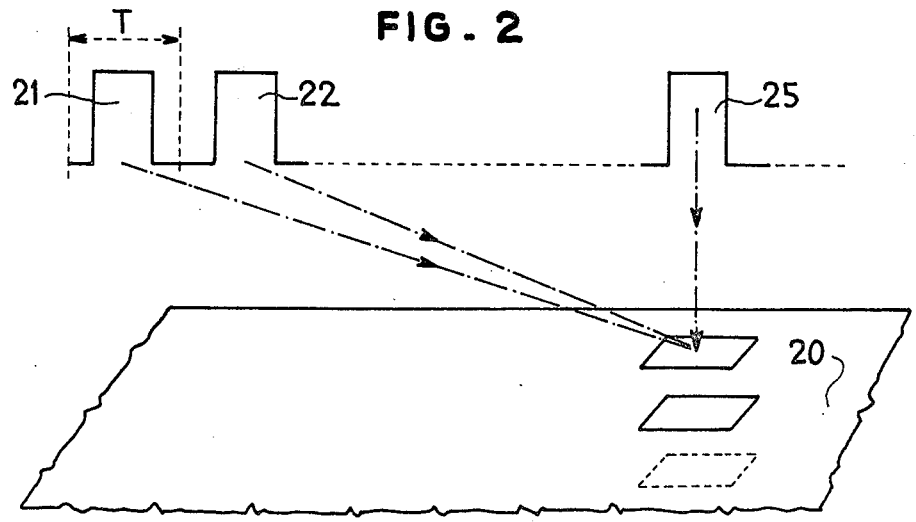

FIG. 2 illustrates three squarewaves 21, 22 and 25 corresponding to three 1 bits belonging to one and the same group, for example the channel $V_1$. In accordance with the principle of the invention, thanks to the means described hereinafter, the bits 21, 22 and 25 are recorded in the form of three holograms occupying the same small area of a physical carrier 20 which, for example, is a photosensitive film which is developed by photographic process.

By way of example, taking a throughput of 100 million bits per second, the periodicity T is around $10^{-8}$ second, the group time is around a microsecond, and the signal portion NMT for N = 10, is around 10 microseconds.

FIG. 3 illustrates an example of means for splitting the signal into groups and for injecting the latter simultaneously into N channels $V_1, V_2 \ldots V_{N-1}, V_N$, in accordance with the principles set out in relation to FIG. 1. A clock 30 acts upon a coder 31 coupled to N gates $P_1, P_2, \ldots P_{N-1}, P_N$, constituted by circuits of known kind. At successive instants and during a predetermined time referred to here as MT, these gates place the input S of the digital signal in communication with N output circuits 32 either through a delay line ($L_1, L_2, \ldots L_{N-1}$) or directly (this is the case with the $N^{th}$ channel). The delays range from MT to (N−1) MT, that is to say, 1 to 9 microseconds in the example chosen. The output circuits 32 are amplifiers or inpedance-matching devices, of known kind. It will readily be seen that the elements hereinbefore referred to constitute a circuit which puts into effect the principle shown in FIG. 1. The output terminals of the channels $V_1, V_2, \ldots, V_{N-1}, V_N$ following the circuits 32 of FIG. 3, have been reproduced in FIG. 4 in a diagram illustrating the holographic recording means. A laser 40 delivers a coherent monochromatic light beam 10 which can either be of variable wavelength or of fixed wavelength as will be seen hereafter. Said beam 10, on encountering a semi-reflective plate 401, produces a reflected beam 11 and a direct beam 12. The beam 11, reflected by a mirror 403, produces a beam 13 which successively passes N-1 semi-transparent plates 404 and is finally incident upon a mirror 405. The beam $Q_1$ issuing from the latter, passes through a light modulator 41 operated through the channel $V_1$. The beams $Q_2 \ldots Q_{N-1}, Q_N$, reflected by the plates 404, pass through modulators 41 identical to the preceding modulator but operated respectively by the channels $V_2; \ldots V_{N-1}, V_N$. In the example described here the modulation is of the "positive" type, the light only passing through the modulator during the time of the squarewaves corresponding to the bits.

The holograms $H_1, H_2 \ldots H_{N-1}, H_N$ are formed upon the record carrier 42 at the intersection between the beams $Q_1, Q_2 \ldots Q_N$, and a reference beam 15 coming from the laser 40, by means of the following arrangements. The beam 12, reflected by the mirror 402 and then focussed by F by a lens 43, is transformed into a wide beam 15 of parallel rays, by a lens 44, this beam constituting the reference beam.

Figure 4:
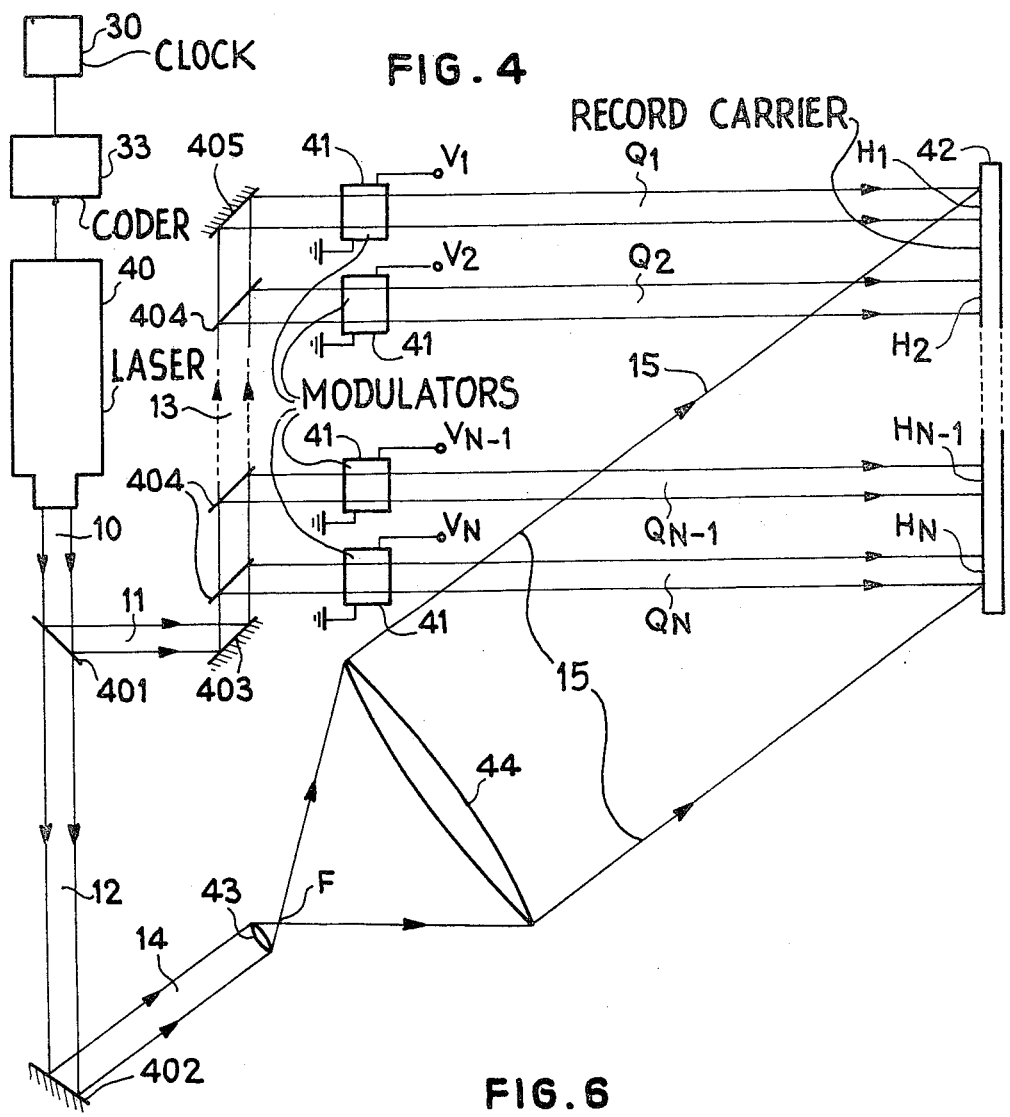

To simplify FIG. 4, the case has been chosen in which the wavelength of the laser is variable. Those skilled in the art will be aware of the existence of such lasers; an apparatus capable of producing M different wavelengths corresponding to M settings, has been chosen, and a coder of known kind has been built in order to regulate emission at the M wavelengths, in a successive fashion. This coder 33 is under the control of the clock 30 shown in FIG. 3. It will readily be appreciated that if the carrier 42 is maintained stationary during the period of duration of a signal group coming from an arbitrary channel, $V_1$ for example, the M data bits of the group will be recorded in the form of M holograms distinguished from each other by the pitch of the interference fringes produced by the interference between the beam $Q_1$ and the beam 15. In the example already chosen, recording lasts for 1 microsecond and there is a dead time of 9 microseconds available before the next signal portion is recorded, since in effect the N groups are recorded simultaneously.

In the case where a normal laser is provided, the means illustrated schematically in FIG. 5 can be used in order to turn the reference beam through a small angle in shifting from one data bit to the next. To this end, a light deflector 50, for example a known kind of electro-accoustic cell, is made dependant upon a coder 53 itself operated by the clock 30 of FIG. 3, in order to produce M different deflections at the rate of the bits. The beam emerging from the deflector 50 is successively passed through two lenses 51 and 52 having respective focal lengths $F_1$ and $F_2$, in order to produce M reference beams as shown in FIG. 4, which are intended for the record carrier 42. The angle $\theta$ between two of these beams, 151 and 152 for example, depends upon the ratio $F_1/F_2$ of the focal lengths, other things being equal. Thus, this ratio can be influenced in order to adjust the value of the angle $\theta$.

Figure 6:
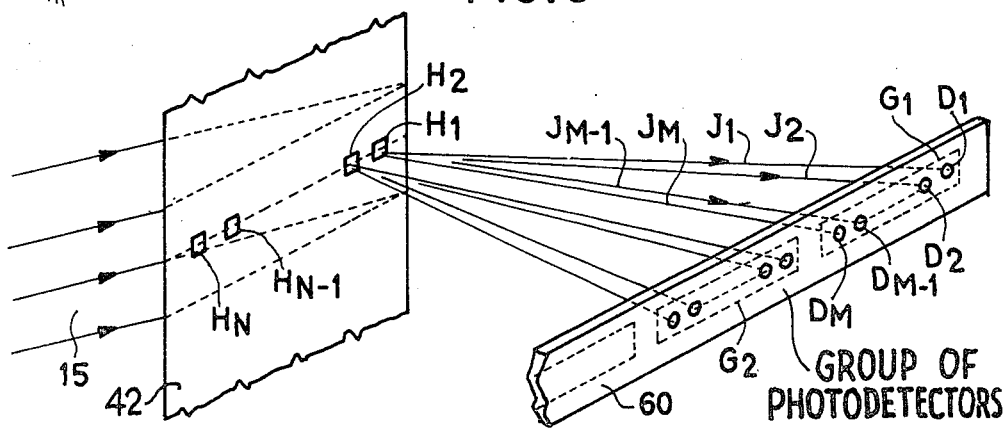

FIG. 6 illustrates the means used for reading out the holograms. The record carrier 42 is assumed to have undergone physico-chemical treatments of a kind required to enable it to be operated by transparency. The illustration is limited to that of the apparatus comprising a block 60 of photodetectors the wiring of which has not been shown. The block comprises N groups $(G_1, G_2 \ldots)$ of M photodetectors $(D_1, D_2, \ldots D_{M-1}, D_M)$. These detectors are for example photodiodes the photosensitive electrode of which is disposed towards the carrier 42. If a reference beam having a fixed direction and fixed wavelength is projected onto the latter, then from the holograms $H_1, H_2 \ldots H_N$ operated in transmission (by transparency in other words), groups of M light beams corresponding to the M bits of each section are produced. The successive beams $J_1, J_2 \ldots J_{M-1}, J_M$ are displaced in relation to one another by a constant angle corresponding:

either to the "shift" in the frequency of the interference fringes, this shift stemming from the shift in the wavelength of the variable laser;

or to the angular shift in the reference beam whose direction can be varied.

FIG. 7 illustrates the means used to reconstitute the signal from the illuminations detected by the diodes $D_1 \ldots D_M$. The clock 30 of FIG. 3 acts upon a coder 70 coupled to M gates $C_1, C_2 \ldots C_{M-1}, C_M$, constituted by circuits of known kind. At successive instants and for a given period of time which is equal to MT in this case, these gates make it possible for the current detected by the diode corresponding to each gate, to flow to an adder circuit 72. The reconstituted signal is picked up at the output terminal 73 of said circuit.

The coder 70 furthermore possesses an output 71 producing control pulses at a rate equal to the duration of the signal portion which has been split into N groups, namely MT. This output 71 is used to control at this rate the step by step advance of the carrier 42, through the agency of a known kind of system which has not been shown here.

In the diagram of FIG. 8, only certain of the main elements of a recording and read-out system have been shown and the illustration in particular omits the whole of the drive system for the take-up reel, pay-off reel and stepping transfer mechanism at recording and read-out stations. The tape 42 representing the physical carrier of like reference, is paid off from a pay-off reel 801 and passes between the recording system marked by a box 82 and the read-out system marked by a box 83. The tape is guided by pulleys 802, 803, 804, 805 and 806. The latter two pulleys facilitate the entry of the tape into the developing system 84. This latter, depending upon the application, will be constituted by one or more photographic developer baths, a heat treatment oven and an irradiation chamber or some other means of fixing the holograms. The signal to be recorded is fed in through the lead S.

The operation of this system is conventional:

The laser 40 and the take-up pay-off means are used both for recording and read-out. At the time of recording, the system 83 is inoperative. At the time of read-out, the system 82 and the means 84 are inoperative.

FIG. 9 illustrates a variant embodiment of the means for breaking down the signal. This is a system which produces time expansion of the groups of M bits. As a matter of fact it has been seen hereabove that in the chosen example there was available before the recording of each section, a dead time of 9 microseconds, more generally an unused period of (N−1) MT seconds. It is worthwhile exploiting the whole of the time NMT in order to spread out the signals in time and thus facilitate the operation of changing the wavelength of the laser or modifying the direction of the reference beam. By spreading out the duration of the bit proper, and not simply the time interval which separates it from the next one, recording is made easier.

A known system for the time expansion of a section of M bits, is schematically illustrated in FIG. 9. It comprises an input circuit 91 for the signal $S_1$, a digital register 92 of the shift-register type with its output taken back to its input, and an output circuit 93 supplying bits of duration N times longer, at a rate which is divided by N. The register 92 is under the direct control of the clock 30 of FIG. 3, whilst the circuits 91 and 93 are controlled by a divider circuit 90 producing division by N. In the present instance, the register 92 has N stages. The operation of the system can be summerised by saying that the first data bit of the group is produced with a shift of N clock pulses after passing through the N stages of the register, the second bit with a shift of 2N pulses corresponding to two transits through the register and so on. M being greater than N in the chosen example, a modification of the order of the bits can occur which can be corrected at the time of reconstitution, by the coder 70 shown in FIG. 7.

The clock 30 of FIGS. 3 and 7 can be replaced by a clock of periodicity MT, provided that the coders are modified in a corresponding way. In this case, the dividers 90 of FIG. 9 are discarded and a multiplier (multiplying by a factor of M) must be arranged between the clock 30 and the register 92.

The use of recording carrier other than a photographic film, is possible in implementation of the invention. In particular, the recording carrier could be:

a photo-thermoplast;
a ferro-electric crystal;
a ferro-electric ceramic;
an amorphous semi-conductor.

What I claim is:

1. A holographic process for the real-time storage and retrieval of high speed digitally encoded information, at the storage phase, comprising the steps of:
    I. breaking down the information into portions of N groups of M bits;
    II. picking off said N groups and distributing them amongst N channels;
    III. imparting to (N−1) groups, different delay times calculated so that the respective digits of said (N−1) groups coincide in time with the digits of the Nth group;
    IV. modulating simultaneously N monochromatic coherent light beams by the N first binary digits of said N groups, said beams being supplied by one monochromatic coherent source;
    V. creating holograms by interference between said beams and a reference beam supplied by said monochromatic coherent source;
    VI. recording N said holograms simultaneously at given points of N parallel tracks predetermined on a physical storage carrier;
    VII. shifting the pitch of the interference fringes constituent of said holograms; and repeating the operations of steps IV − VI on second binary digits of said N groups so that the holograms of steps V − VI are superimposed on the preceding holograms at the same given points;
    VIII. repeating the operations of steps IV − VI on the further binary digits of said N groups up to exhausting of the information of said groups; and
    at the retrieval phase, comprising the steps of projecting a fixed coherent monochromatic light beam onto the holograms recorded at step VI, detecting light beams respectively produced by said holograms, and reading-out sequentially the detected currents.

2. A storage process as claimed in claim 1, wherein at step (VII), the wavelength of said coherent light periodically assumes M different values.

3. A storage process as claimed in claim 1, wherein at step (VII) said reference beam is orientated successively in accordance with M different values.

4. A storage as claimed in claim 1, wherein between steps (III), and (IV), there is a supplementary step consisting of the distribution of the M bits of one and the same group, over a time interval which is at the most equal to NMT, where T is the recurrence periodicity of said bits.

5. A storage process as claimed in claim 4, wherein during the said supplementary step the duration proper of each bit is increased by a quantity at the most equal to NMT/2.

6. A retrieval process, implementing the process claimed in claim 1, in which steps are the following:
    a. development of the carrier;
    b. projection of a fixed coherent light beam producing subsidiary light beams from holograms which correspond to 1 bit of said signal;
    c. detection of said subsidiary light beams during the time of a portion of said signal;
    d. sequential read-out of the detected currents in order to reconstitute said portion of said signal;
    e. advance of said carrier and repetition of steps (b) to (d) hereinbefore referred to, in order to reconstitute an ensuing portion of said signal.

* * * * *